United States Patent
Li et al.

(10) Patent No.: US 11,264,238 B2
(45) Date of Patent: Mar. 1, 2022

(54) FORMING III NITRIDE ALLOYS

(71) Applicant: KING ABDULLAH UNIVERSITY OF SCIENCE AND TECHNOLOGY, Thuwal (SA)

(72) Inventors: Xiaohang Li, Thuwal (SA); Kaikai Liu, Thuwal (SA)

(73) Assignee: KING ABDULLAH UNIVERSITY OF SCIENCE AND TECHNOLOGY, Thuwal (SA)

( * ) Notice: Subject to any disclaimer, the term of this patent is extended or adjusted under 35 U.S.C. 154(b) by 0 days.

(21) Appl. No.: 16/764,623

(22) PCT Filed: Dec. 4, 2018

(86) PCT No.: PCT/IB2018/059643
§ 371 (c)(1),
(2) Date: May 15, 2020

(87) PCT Pub. No.: WO2019/111161
PCT Pub. Date: Jun. 13, 2019

(65) Prior Publication Data
US 2020/0402791 A1 Dec. 24, 2020

Related U.S. Application Data

(60) Provisional application No. 62/594,779, filed on Dec. 5, 2017.

(51) Int. Cl.
H01L 21/00 (2006.01)
H01L 21/02 (2006.01)

(52) U.S. Cl.
CPC .... H01L 21/0254 (2013.01); H01L 21/02296 (2013.01); H01L 21/02617 (2013.01)

(58) Field of Classification Search
None
See application file for complete search history.

(56) References Cited

U.S. PATENT DOCUMENTS

2006/0049417 A1   3/2006   Li et al.
2007/0164299 A1   7/2007   Lahreche et al.
2009/0045438 A1   2/2009   Inoue et al.

FOREIGN PATENT DOCUMENTS

JP   2013069971 A   4/2013
WO   2006030064 A1  3/2006
(Continued)

OTHER PUBLICATIONS

International Search Report in corresponding/related International Application No. PCT/IB2018/059643, dated Mar. 13, 2019.
(Continued)

Primary Examiner — Reema Patel
(74) Attorney, Agent, or Firm — Patent Portfolio Builders PLLC

(57) ABSTRACT

A method for forming a semiconductor device involves selecting a substrate on which a wurtzite III-nitride alloy layer will be formed, and a piezoelectric polarization and an effective piezoelectric coefficient for the wurtzite III-nitride alloy layer. It is determined whether there is a wurtzite III-nitride alloy composition satisfying the selected effective piezoelectric coefficient. It is also determined whether there is a thickness for a layer formed from the wurtzite III-nitride alloy composition satisfying the selected piezoelectric polarization based on the selected substrate and the selected effective piezoelectric coefficient. Responsive to the determination that there is a wurtzite III-nitride alloy composition having a lattice constant satisfying the selected effective piezoelectric coefficient and a thickness for the layer formed from the wurtzite III-nitride alloy composition satisfying the selected piezoelectric polarization, the wurtzite III-nitride
(Continued)

alloy layer is formed on the substrate having the wurtzite III-nitride alloy composition satisfying the selected effective piezoelectric coefficient and having the thickness satisfying the selected piezoelectric polarization.

19 Claims, 7 Drawing Sheets

(56) References Cited

FOREIGN PATENT DOCUMENTS

| WO | 2007077666 A1 | 7/2007 |
| WO | 2011108063 A1 | 9/2011 |

OTHER PUBLICATIONS

Written Opinion of the International Searching Authority in corresponding/related International Application No. PCT/IB2018/059643, dated Mar. 13, 2019.

First Office Action in corresponding/related Japanese Application No. 2020-530579, dated Oct. 4, 2021.

FORMING III NITRIDE ALLOYS

CROSS-REFERENCE TO RELATED APPLICATIONS

This application is a U.S. National Stage Application of International Application No. PCT/IB2018/059643, filed on Dec. 4, 2018, which claims priority to U.S. Provisional Patent Application No. 62/594,779, filed on Dec. 5, 2017, entitled "METHODS OF CHANGING SENSITIVITY OF STRAIN FOR POLARIZATION OF III-NITRIDE MATERIALS AND HETEROJUNCTIONS," the disclosures of which are incorporated herein by reference in their entirety.

BACKGROUND

Technical Field

Embodiments of the disclosed subject matter generally relate to methods for forming a III-nitride alloy layer having a desired total polarization, or a desired piezoelectric polarization, based on the effective piezoelectric coefficient, strain, and lattice constant of the wurtzite III-nitride alloy layer.

Discussion of the Background

Wurtzite (WZ) III-nitride semiconductors and their alloys are particularly advantageous for use in optoelectronic devices, such as visible and ultraviolet light emitting diodes (LEDs), laser diodes, and high-power devices, such as high electron mobility transistors (HEMTs). Due to the asymmetry of the wurtzite structure, the III-nitrides and their heterojunctions can exhibit strong spontaneous polarization (SP) and piezoelectric (PZ) polarization, which can greatly influence the operation of the semiconductor device. For example, LEDs and laser diodes can have reduced radiative recombination rates and shifts in emission wavelength due to the quantum-confined Stark effect (QCSE) caused by the internal polarization field in the quantum well (QW). Thus, for these types of devices, a smaller polarization difference at the interface of the heterojunction could advantageously minimize or eliminate the quantum-confined Stark effect. In contrast, high electron mobility transistors (HEMTs) require a high polarization difference at the interface of the heterojunction to produce strong carrier confinement and formation of two-dimensional electron gas (2DEG).

The polarization of a wurtzite III-nitride alloy layer is determined based on the spontaneous polarization and the piezoelectric polarization of the layer. The polarization of a wurtzite III-nitride alloy layer is currently calculated using polarization constants of wurtzite III-nitride alloys that may not be accurate. Specifically, the conventional polarization constants of wurtzite III-nitride ternary alloys used by most people are based on linear interpolation of the binary material constants (i.e., of boron nitride (BN), aluminum nitride (AlN), gallium nitride (GaN), and indium nitride (InN)). However, there could be considerable nonlinearity in the spontaneous polarization and piezoelectric polarization of wurtzite III-nitride ternary alloys (e.g., AlGaN, InGaN, InAlN, BAlN, and BGaN) versus the respective binary material composition.

Further, which particular factors influence the piezoelectric polarization of a wurtzite III-nitride alloy layer is not currently well-understood.

Thus, it would be desirable to identify the factors influencing the piezoelectric polarization of a wurtzite III-nitride alloy layer so that these factors can be employed to form a wurtzite III-nitride alloy layer having a desired piezoelectric, and in turn, total polarization.

SUMMARY

According to an embodiment, there is a method for forming a semiconductor device. A substrate on which a wurtzite III-nitride alloy layer will be formed is selected. A piezoelectric polarization is selected for the wurtzite III-nitride alloy layer. An effective piezoelectric coefficient is selected for the wurtzite III-nitride alloy layer. It is determined whether there is a wurtzite III-nitride alloy composition satisfying the selected effective piezoelectric coefficient. It is also determined whether there is a thickness for a layer formed from the wurtzite III-nitride alloy composition satisfying the selected piezoelectric polarization based on the selected substrate and the selected effective piezoelectric coefficient. Responsive to the determination that there is a wurtzite III-nitride alloy composition having a lattice constant satisfying the selected effective piezoelectric coefficient and a thickness for the layer formed from the wurtzite III-nitride alloy composition satisfying the selected piezoelectric polarization, the wurtzite III-nitride alloy layer is formed on the substrate comprising the wurtzite III-nitride alloy composition satisfying the selected effective piezoelectric coefficient and having the thickness satisfying the selected piezoelectric polarization.

According to another embodiment, there is a method for forming a wurtzite III nitride layer having an effective piezoelectric coefficient within a desired effective piezoelectric coefficient range. An effective piezoelectric coefficient for the wurtzite III nitride layer is determined based on a composition of the wurtzite III nitride layer. Whether the determined effective piezoelectric coefficient is within the desired effective piezoelectric coefficient range is then determined. Responsive to the determination that the determined effective piezoelectric coefficient is not within the desired effective piezoelectric coefficient range, the composition of the wurtzite III nitride layer is adjusted. An amount of boron, gallium, or indium is increased in the adjusted composition of the wurtzite III nitride layer when the determined effective piezoelectric coefficient is greater than the desired effective piezoelectric coefficient range. An amount of aluminum is increased in the adjusted composition of the wurtzite III nitride layer when the determined effective piezoelectric coefficient is less than the desired effective piezoelectric coefficient range. The wurtzite III nitride layer is formed using the adjusted composition of the wurtzite III nitride layer.

According to a further embodiment, there is a method for forming a semiconductor device. A substrate on which a wurtzite III-nitride alloy layer will be formed is selected. A piezoelectric polarization is selected for the wurtzite III-nitride alloy. A wurtzite III-nitride alloy composition is selected for the wurtzite III-nitride alloy layer. It is then determined whether there is a strain value for the selected wurtzite III-nitride alloy composition satisfying the selected piezoelectric polarization. Responsive to the determination that there is a strain value for the selected wurtzite III-nitride alloy composition satisfying the selected piezoelectric polarization, the wurtzite III-nitride alloy layer is formed having the selected wurtzite III-nitride alloy composition on the selected substrate so that the formed wurtzite III-nitride alloy layer exhibits the strain value.

BRIEF DESCRIPTION OF THE DRAWINGS

The accompanying drawings, which are incorporated in and constitute a part of the specification, illustrate one or more embodiments and, together with the description, explain these embodiments. In the drawings.

DETAILED DESCRIPTION

The following description of the exemplary embodiments refers to the accompanying drawings. The same reference numbers in different drawings identify the same or similar elements. The following detailed description does not limit the invention. Instead, the scope of the invention is defined by the appended claims. The following embodiments are discussed, for simplicity, with regard to the terminology and structure of wurtzite III-nitride layers.

Reference throughout the specification to "one embodiment" or "an embodiment" means that a particular feature, structure or characteristic described in connection with an embodiment is included in at least one embodiment of the subject matter disclosed. Thus, the appearance of the phrases "in one embodiment" or "in an embodiment" in various places throughout the specification is not necessarily referring to the same embodiment. Further, the particular features, structures or characteristics may be combined in any suitable manner in one or more embodiments.

Figure 1:
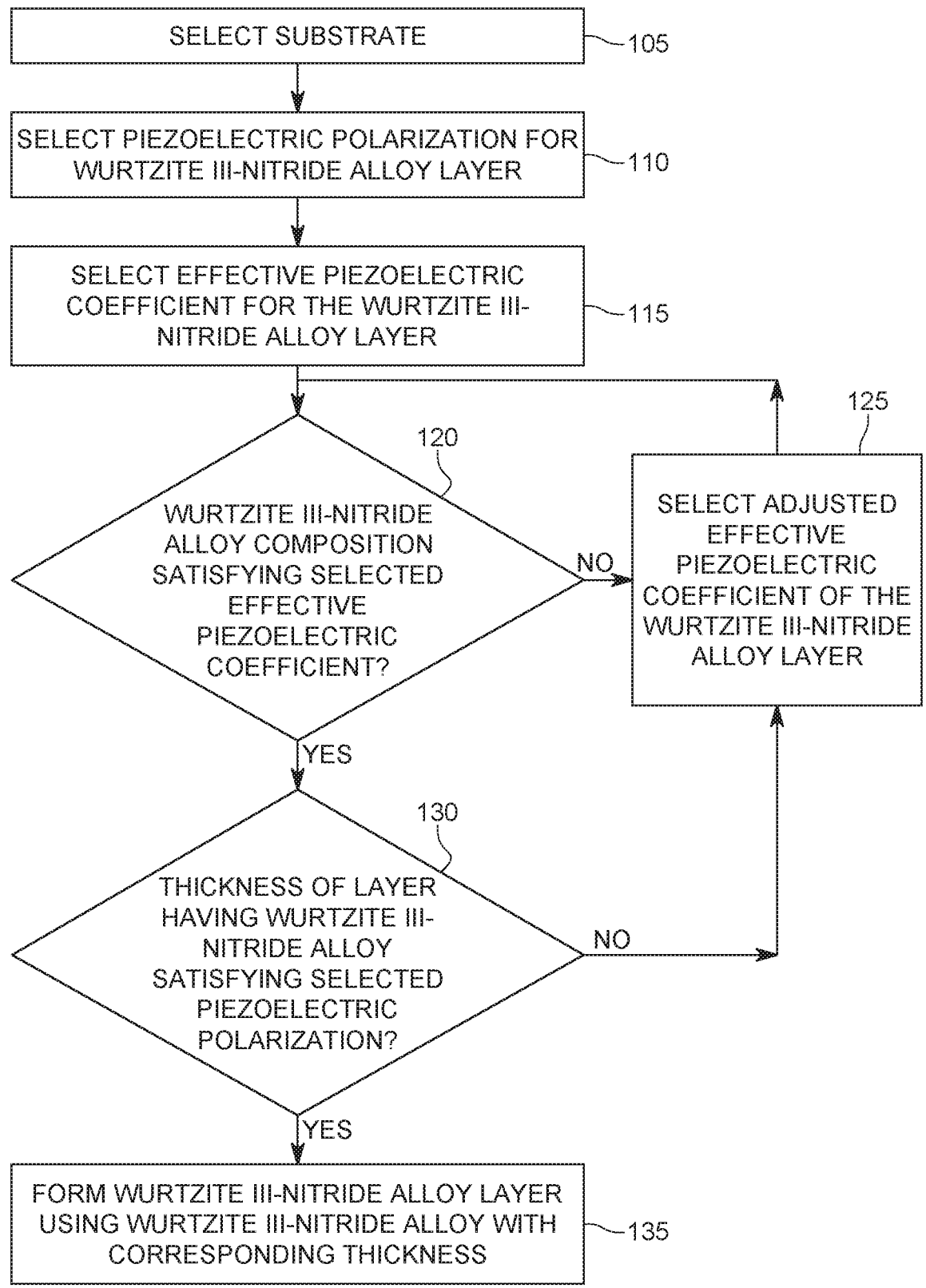
FIG. 1 is a flowchart of a method for forming a wurtzite III-nitride alloy layer according to embodiments.

FIG. 1 is a flowchart of a method for forming a semiconductor device. Initially, a substrate on which a wurtzite III-nitride alloy layer will be formed is selected (step 105). The substrate can be, for example, a gallium nitride (GaN) substrate, an aluminum nitride (AlN) substrate, a sapphire substrate, etc. Next, a piezoelectric polarization is selected for the wurtzite III-nitride alloy layer (step 110). As reflected in the following equation, the sum of the piezoelectric polarization $P_{PZ}(x)$ and the spontaneous polarization $P_{SP}(x)$ defines the total polarization of the wurtzite III-nitride alloy layer $A_xC_{1-x}N$.

$$P(A_xC_{1-x}N) = P_{SP}(x) + P_{PZ}(x) \tag{1}$$

Next, an effective piezoelectric coefficient is selected for the wurtzite III-nitride alloy layer (step 115). As reflected in the equation below, the piezoelectric polarization $P_{PZ}(x)$ can be represented by a product of the effective piezoelectric coefficient in the C-plane $e_{\text{eff}}$ and the strain $\varepsilon_1$:

$$P_{PZ} = e_{\text{eff}} \varepsilon_1 \tag{2}$$

It is then determined whether there is a wurtzite III-nitride alloy composition satisfying the selected effective piezoelectric coefficient (step 120). This determination can involve using the following equation for determining the effective piezoelectric coefficient $e_{\text{eff}}$ based on the particular composition of the wurtzite III-nitride alloy $A_xC_{1-x}N$:

$$e_{\text{eff}} = 2\left(e_{31}(x) - P_{SP}(x) - \frac{C_{13}(x)}{C_{33}(x)} e_{33}(x)\right) \tag{3}$$

where $e_{31}$ is the internal-strain term of the piezoelectric constant, $e_{33}$ is the clamped-ion term of the piezoelectric constant (which is determined using the internal parameter $\mu$ fixed), $e_{31}(x)$ and $e_{33}(x)$ are the piezoelectric constants of the wurtzite III-nitride alloy layer in units of C/m$^2$, and $C_{13}(x)$ and $C_{33}(x)$ are the elastic constants of the wurtzite III-nitride alloy layer in units of GPa.

For purpose of this discussion, the wurtzite III-nitride alloy $A_xC_{1-x}N$ can be aluminum gallium nitride ($Al_xGa_{1-x}N$), indium gallium nitride ($In_xGa_{1-x}N$), indium aluminum nitride ($In_xAl_{1-x}N$), boron aluminum nitride ($B_xAl_{1-x}N$), or boron gallium nitride ($B_xGa_{1-x}N$). Accordingly, the spontaneous polarization of $Al_xGa_{1-x}N$, $In_xGa_{1-x}N$, $In_xAl_{1-x}N$, $B_xAl_{1-x}N$, and $B_xGa_{1-x}N$ can be determined using the following equations:

$$P_{sp}^{(H\,Ref)}(Al_xGa_{1-x}N) = 0.0072x^2 - 0.0127x + 1.3389 \tag{4}$$

$$P_{sp}^{(H\,Ref)}(In_xGa_{1-x}N) = 0.1142x^2 - 0.2892x + 1.3424 \tag{5}$$

$$P_{sp}^{(H\,Ref)}(In_xAl_{1-x}N) = 0.1563x^2 - 0.3323x + 1.3402 \tag{6}$$

$$P_{sp}^{(H\,Ref)}(B_xAl_{1-x}N) = 0.6287x^2 + 0.1217x + 1.3542 \tag{7}$$

$$P_{sp}^{(H\,Ref)}(B_xGa_{1-x}N) = 0.4383x^2 + 0.3135x + 1.3544 \tag{8}$$

The piezoelectric constants $e_{31}$ and $e_{33}$ of $Al_xGa_{1-x}N$, $In_xGa_{1-x}N$, $In_xAl_{1-x}N$, $B_xAl_{1-x}N$, and $B_xGa_{1-x}N$ can be determined using the following equations:

$$e_{31}(Al_xGa_{1-x}N) = -0.0573x^2 - 0.2536x - 0.3582 \tag{9}$$

$$e_{33}(Al_xGa_{1-x}N) = 0.3949x^2 + 0.6324x + 0.6149 \tag{10}$$

$$e_{31}(In_xGa_{1-x}N) = 0.2396x^2 - 0.4483x - 0.3399 \tag{11}$$

$$e_{33}(In_xGa_{1-x}N) = -0.1402x^2 + 0.5902x + 0.6080 \tag{12}$$

$$e_{31}(In_xAl_{1-x}N) = -0.0959x^2 + 0.239x - 0.6699 \tag{13}$$

$$e_{33}(In_xAl_{1-x}N) = 0.9329x^2 - 1.5036x + 1.6443 \tag{14}$$

$$e_{31}(B_xAl_{1-x}N) = 1.7616x^2 - 0.9003x - 0.6016 \tag{15}$$

$$e_{33}(B_xAl_{1-x}N) = -4.0355x^2 + 1.6836x + 1.5471 \tag{16}$$

$$e_{31}(B_xGa_{1-x}N) = 0.9809x^2 - 0.4007x - 0.3104 \tag{17}$$

$$e_{33}(B_xGa_{1-x}N) = -2.1887x^2 + 0.8174x + 0.5393 \tag{18}$$

The elastic constants $C_{13}$ and $C_{33}$ of $Al_xGa_{1-x}N$, $In_xGa_{1-x}N$, $In_xAl_{1-x}N$, $B_xAl_{1-x}N$, and $B_xGa_{1-x}N$ can be determined using the Vegard's law and the binary constants as follows the following equations:

$$C_{13}(B_xAl_{1-x}N) = xC_{13}(BN) + (1-x)C_{13}(AlN) \tag{19}$$

$$C_{13}(B_xGa_{1-x}N) = xC_{13}(BN) + (1-x)C_{13}(GaN) \tag{20}$$

$$C_{13}(Al_xGa_{1-x}N) = xC_{13}(AlN) + (1-x)C_{13}(GaN) \tag{21}$$

$$C_{13}(In_xGa_{1-x}N) = xC_{13}(InN) + (1-x)C_{13}(GaN) \tag{22}$$

$$C_{13}(In_xAl_{1-x}N) = xC_{13}(InN) + (1-x)C_{13}(AlN) \tag{23}$$

$$C_{33}(B_xAl_{1-x}N) = xC_{33}(BN) + (1-x)C_{33}(AlN) \tag{24}$$

$$C_{33}(B_xGa_{1-x}N) = xC_{33}(BN) + (1-x)C_{33}(GaN) \tag{25}$$

$$C_{33}(Al_xGa_{1-x}N) = xC_{33}(AlN) + (1-x)C_{33}(GaN) \tag{26}$$

$$C_{33}(In_xGa_{1-x}N) = xC_{33}(InN) + (1-x)C_{33}(GaN) \tag{27}$$

$$C_{33}(In_xAl_{1-x}N) = xC_{33}(InN) + (1-x)C_{33}(AlN) \tag{28}$$

Figure 2:
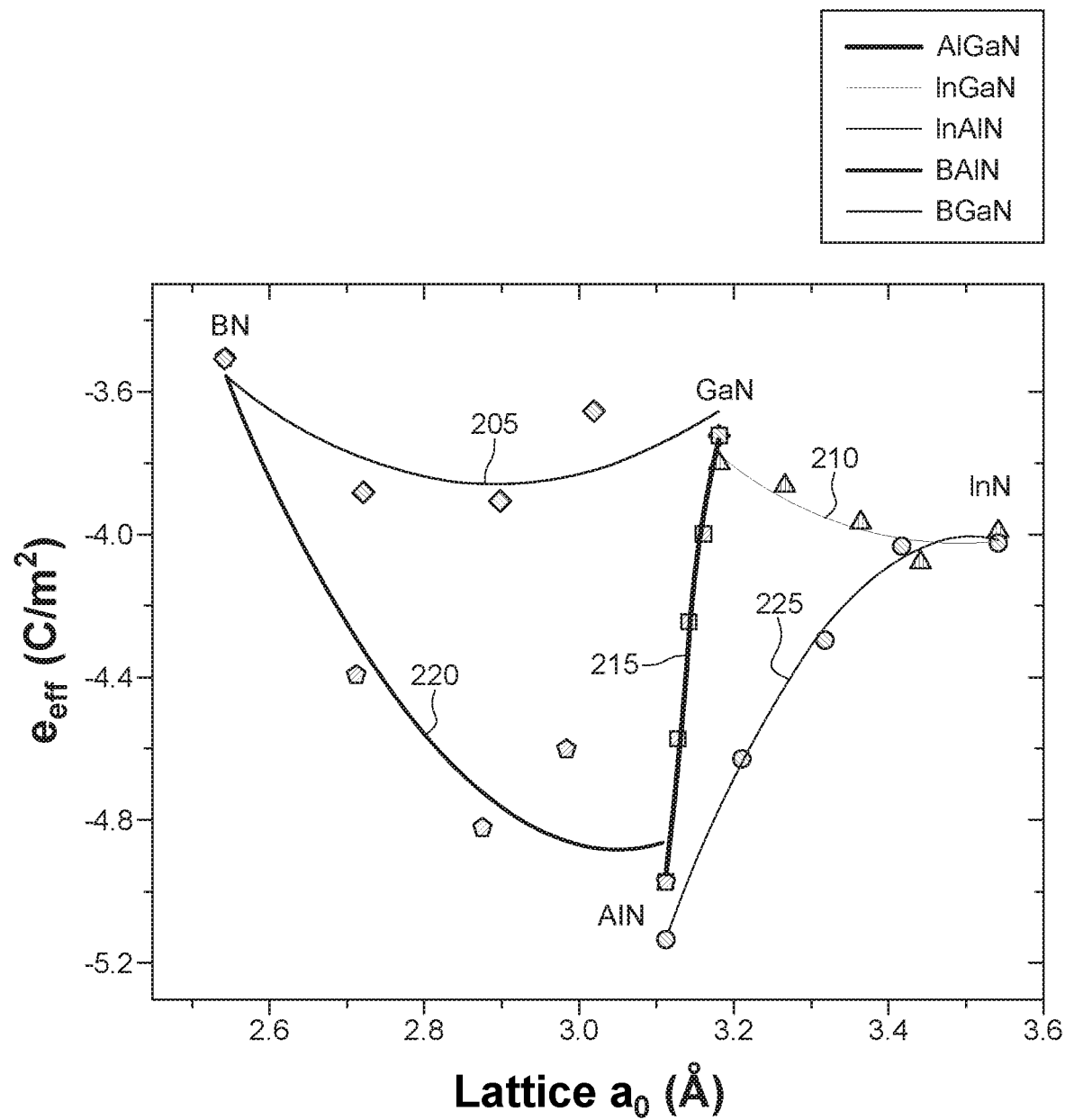
FIG. 2 is a graph illustrating the effective piezoelectric coefficient of wurtzite III-nitride materials according to embodiments.

As an alternative to using the equations above to determine whether there is a wurtzite III-nitride alloy composition satisfying the selected effective piezoelectric coefficient, a graph can be constructed of the change in lattice constant a versus the change in effective piezoelectric coefficient $e_{\it eff}$ for different wurtzite III-nitride alloy compositions, an example of which is illustrated in FIG. 2.

The graph of FIG. 2 was generated by determining the effective piezoelectric coefficient $e_{\it eff}$ and corresponding lattice constant $a_0$ of the wurtzite III-nitride alloy layer at full relaxation (i.e., 100% relaxation) for a number of different compositions (represented by the squares, pentagons, diamonds, and circles in the figure) and creating matching curves 205-225.

Curve 205 illustrates the change in lattice constant $a_0$ versus the change in effective piezoelectric coefficient $e_{\it eff}$ of the composition as gallium is added to boron nitride moving from boron nitride (BN) to gallium nitride (GaN) and vice-versa. Curve 210 illustrates the change in lattice constant $a_0$ versus the change in effective piezoelectric coefficient $e_{\it eff}$ of the composition as indium is added to gallium nitride moving from gallium nitride (GaN) to indium nitride (InN) and vice-versa. Curve 215 illustrates the change in lattice constant $a_0$ versus the change in effective piezoelectric coefficient $e_{\it eff}$ of the composition as aluminum is added to gallium nitride moving from gallium nitride (GaN) to aluminum nitride (AlN) and vice-versa. Curve 220 illustrates the change in lattice constant $a_0$ versus the change in effective piezoelectric coefficient $e_{\it eff}$ of the composition as aluminum is added to boron nitride moving from boron nitride (BN) to aluminum nitride (AlN) and vice-versa. Curve 220 illustrates the change in lattice constant $a_0$ versus the change in effective piezoelectric coefficient $e_{\it eff}$ of the composition as indium is added to aluminum nitride moving from aluminum nitride (AlN) to indium nitride (InN) and vice-versa.

As illustrated in FIG. 2, different ternary wurtzite III-nitride alloys have various ranges of effective piezoelectric coefficient $e_{\it eff}$. If a smaller effective piezoelectric coefficient $e_{\it eff}$ is desired, BGaN and InGaN can be formed on a substrate as the wurtzite III-nitride alloy layer. If a larger effective piezoelectric coefficient $e_{\it eff}$ is desired, high aluminum content BAlN, AlGaN, or AlInN can be formed on a substrate as the wurtzite III-nitride alloy layer. Thus, as will be appreciated from FIG. 2, the effective piezoelectric coefficient $e_{\it eff}$ can be increased by adding or increasing the amount of aluminum in the wurtzite III-nitride alloy. Further, if reduced effective piezoelectric coefficient $e_{\it eff}$ is desired, boron, gallium, or indium can be added or increased in the wurtzite III-nitride alloy.

Identifying one or more wurtzite III-nitride alloys satisfying the effective piezoelectric coefficient $e_{\it eff}$ using the graph in FIG. 2 is particularly advantageous because the lattice constant $a_0$ is used in connection with the strain in step 130.

Returning to FIG. 1, if it is determined that there are no wurtzite III-nitride alloy compositions satisfying the selected piezoelectric coefficient ("No" path out of decision step 120), then an adjusted effective piezoelectric coefficient is selected for the wurtzite III-nitride alloy layer (step 125) and it is determined whether there are any wurtzite III-nitride alloy compositions satisfying the adjusted effective piezoelectric coefficient (step 120).

If, however, there are one or more wurtzite III-nitride alloy compositions satisfying the selected piezoelectric coefficient ("Yes" path out of decision step 120), it is determined whether there is a thickness of a layer for any of the one or more wurtzite III-nitride alloy compositions satisfying the selected piezoelectric polarization (step 130). This determination is performed because the thickness can influence the strain and relaxation of the wurtzite III-nitride alloy layer, depending on the substrate and layer's lattice constant between the substrate and the layer. As discussed above and reflected in equation (2), the piezoelectric polarization $P_{PZ}(x)$ is represented by a product of the effective piezoelectric coefficient in the C-plane $e_{\it eff}$ and the strain $\varepsilon_1$. The strain $\varepsilon_1$ can be represented by the following equation:

$$\varepsilon_1 = \frac{a - a_0}{a_0} \qquad (29)$$

where a is the lattice constant at a certain degree of relaxation (0%≤relaxation≤100%) and $a_0$ is the lattice constant of the wurtzite III-nitride alloy layer at full relaxation (i.e., 100% relaxation). Because the term a is the lattice constant at a certain degree of relaxation, the value of a is based on at least the composition of the selected substrate. If the selected substrate comprises the same material and composition as the wurtzite III-nitride alloy layer and the wurtzite III-nitride alloy layer is grown directly on the substrate, the value of a is typically the same as the lattice constant $a_0$ of the substrate regardless of the thickness of the wurtzite III-nitride alloy layer. If the selected substrate comprises a different material or a different composition of the same material than the wurtzite III-nitride alloy layer and the wurtzite III-nitride alloy layer is grown directly on the substrate, the value of a will vary depending upon the thickness of the wurtzite III-nitride alloy layer formed on the substrate. Specifically, the value of a will be a value between the lattice constant of the substrate (when the wurtzite III-nitride alloy layer is extremely thin) and the lattice constant of the wurtzite III-nitride alloy layer (when the wurtzite III-nitride alloy layer is extremely thick, or beyond the critical thickness).

Accordingly, the lattice constant of the wurtzite III-nitride alloy layer at full relaxation $a_0$ can be determined using the graph of FIG. 2, using the equations below, or by other methods such as X-ray diffraction and transmission electron microscope. The lattice constants of the wurtzite BAlN, wurtzite BGaN, wurtzite InAlN, wurtzite AlGaN, and wurtzite InGaN can be calculated as follows:

$$a_0(B_xAl_{1-x}N) = -0.157x^2 - 0.408x + 3.109 (\text{Å}) \qquad (30)$$

$$a_0(B_xGa_{1-x}N) = -0.101x^2 - 0.529x + 3.176 (\text{Å}) \qquad (31)$$

$$a_0(In_xAl_{1-x}N) = 0.5298x^2 + 0.37398x + 3.109 (\text{Å}) \qquad (32)$$

$$a_0(Al_xGa_{1-x}N) = 0.01589x^2 - 0.08416x + 3.182 (\text{Å}) \qquad (33)$$

$$a_0(In_xGa_{1-x}N) = 0.012x^2 + 0.34694x + 3.182 (\text{Å}) \qquad (34)$$

Because, at this stage of the method, the substrate, piezoelectric polarization, and effective piezoelectric coefficient (or adjusted effective piezoelectric coefficient) have been selected and at least one III-nitride alloy composition satisfying the effective piezoelectric coefficient has been identified, the determination of step 130 is based on the substrate and the thickness of the wurtzite III-nitride alloy layer because these are the variables defining the lattice constant a at a certain degree of relaxation.

If there are no thicknesses for a layer having the particular wurtzite III-nitride alloy composition identified in step 120 that satisfy the selected piezoelectric polarization ("No" path out of decision step 130), then an adjusted effective piezoelectric coefficient is selected for the wurtzite III-nitride alloy layer (step 125) and it is determined whether there are any wurtzite III-nitride alloy compositions satisfying the adjusted effective piezoelectric coefficient (step 120).

If, however, there are thickness for a layer having the particular wurtzite III-nitride alloy composition(s) identified in step 120 satisfying the selected piezoelectric polarization ("Yes" path out of decision step 130), then the wurtzite III-nitride alloy layer is formed using the wurtzite III-nitride alloy composition and corresponding thickness (step 135).

The formation of the wurtzite III-nitride layer (or wurtzite III-nitride alloy layer) in the method of FIG. 1 can employ metalorganic vapor deposition, molecular beam epitaxy, high-temperature post-deposition annealing, or any other similar process.

Although FIG. 1 illustrates the selections in steps 105-115 being performed in a particular order and in a serial fashion, these selections can be made in a different order and/or can be performed in parallel.

Figure 3:
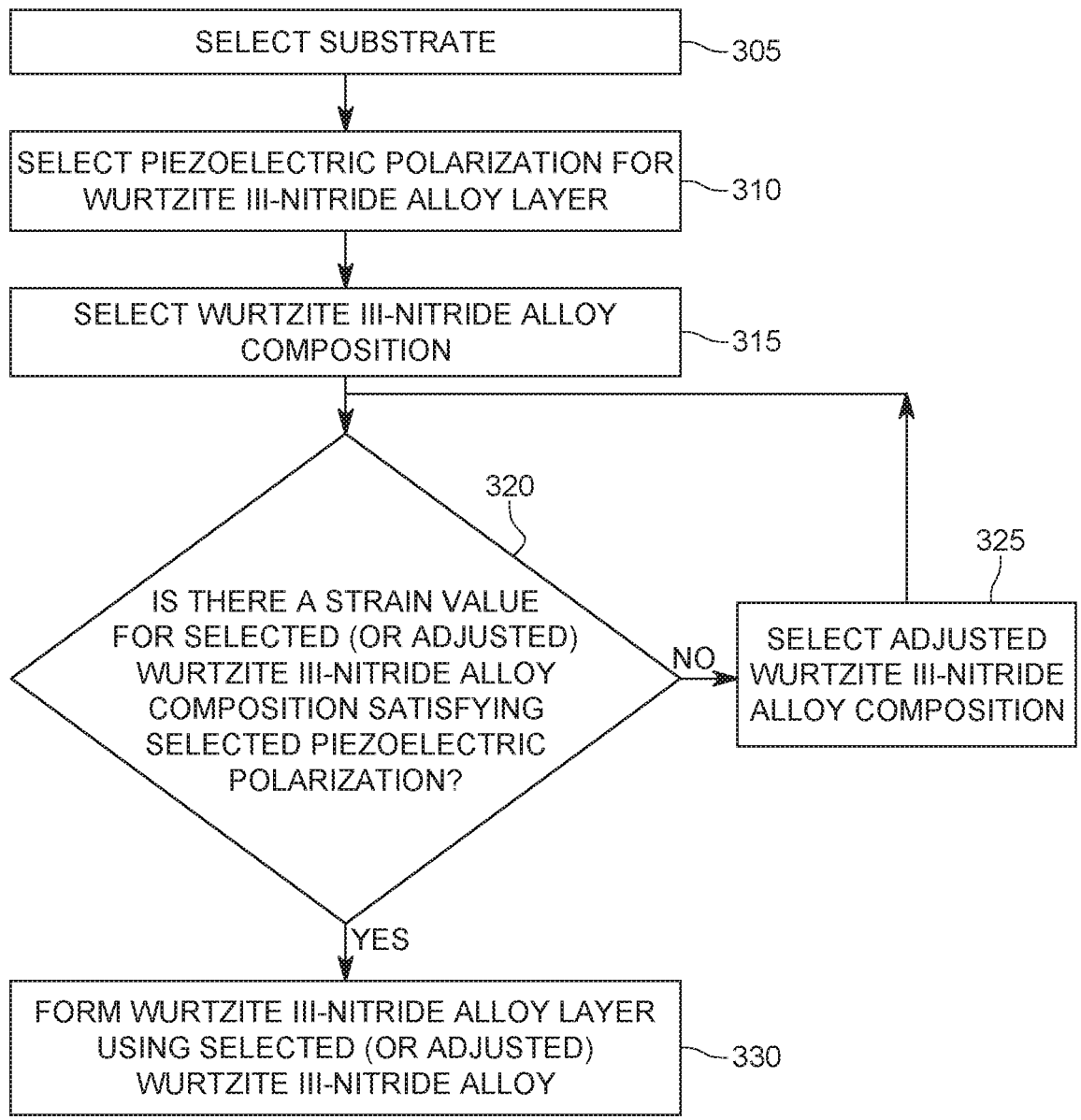
FIG. 3 is a flowchart of a method for forming a wurtzite III-nitride alloy layer according to embodiments.

FIG. 3 is a flowchart of a method for forming a wurtzite III-nitride alloy layer according to embodiments. Similar to the method of FIG. 1, in the method of FIG. 3 the substrate is selected (step 305) and the piezoelectric polarization for the wurtzite III-nitride alloy layer is selected (310). In this method, however, the composition of the wurtzite III-nitride alloy is selected (step 315). Accordingly, it is then determined whether there is a strain value for the selected wurtzite III-nitride alloy composition satisfying the selected piezoelectric polarization. This determination can employ the following equation, which is a substitution of equation (29) into equation (2):

$$P_{PZ} = e_{eff}\left(\frac{a - a_0}{a_0}\right) \quad (35)$$

Because the substrate, the piezoelectric coefficient, and the composition of the wurtzite III-nitride alloy layer has already been selected, the only variable that can influence the strain term $\varepsilon_1$ is the thickness of the wurtzite III-nitride alloy layer (assuming that the material and composition of the wurtzite III-nitride alloy and the substrate are different).

If there is not a strain value for the selected wurtzite III-nitride alloy composition satisfying the selected piezoelectric polarization ("No" path out of decision step 320), then an adjusted wurtzite III-nitride alloy composition is selected (step 325) and it is determined whether there is a strain value for the adjusted wurtzite III-nitride alloy composition satisfying the selected piezoelectric polarization (step 320). If, however, there is a strain value for the selected (or adjusted) wurtzite III-nitride alloy satisfying the selected piezoelectric polarization ("Yes" path out of decision step 320), then the wurtzite III-nitride alloy layer is formed on the selected substrate using the selected (or adjusted) wurtzite III-nitride alloy having the thickness to achieve the strain value (assuming that the compositions of the wurtzite III-nitride alloy and the substrate are different) (step 330).

The formation of the wurtzite III-nitride layer (or wurtzite III-nitride alloy layer) in the method of FIG. 3 can employ metalorganic vapor deposition, molecular beam epitaxy, high-temperature post-deposition annealing, or any other similar process.

Although FIG. 3 illustrates the selections in steps 305-315 being performed in a particular order and in a serial fashion, these selections can be made in a different order and/or can be performed in parallel.

Figure 4:
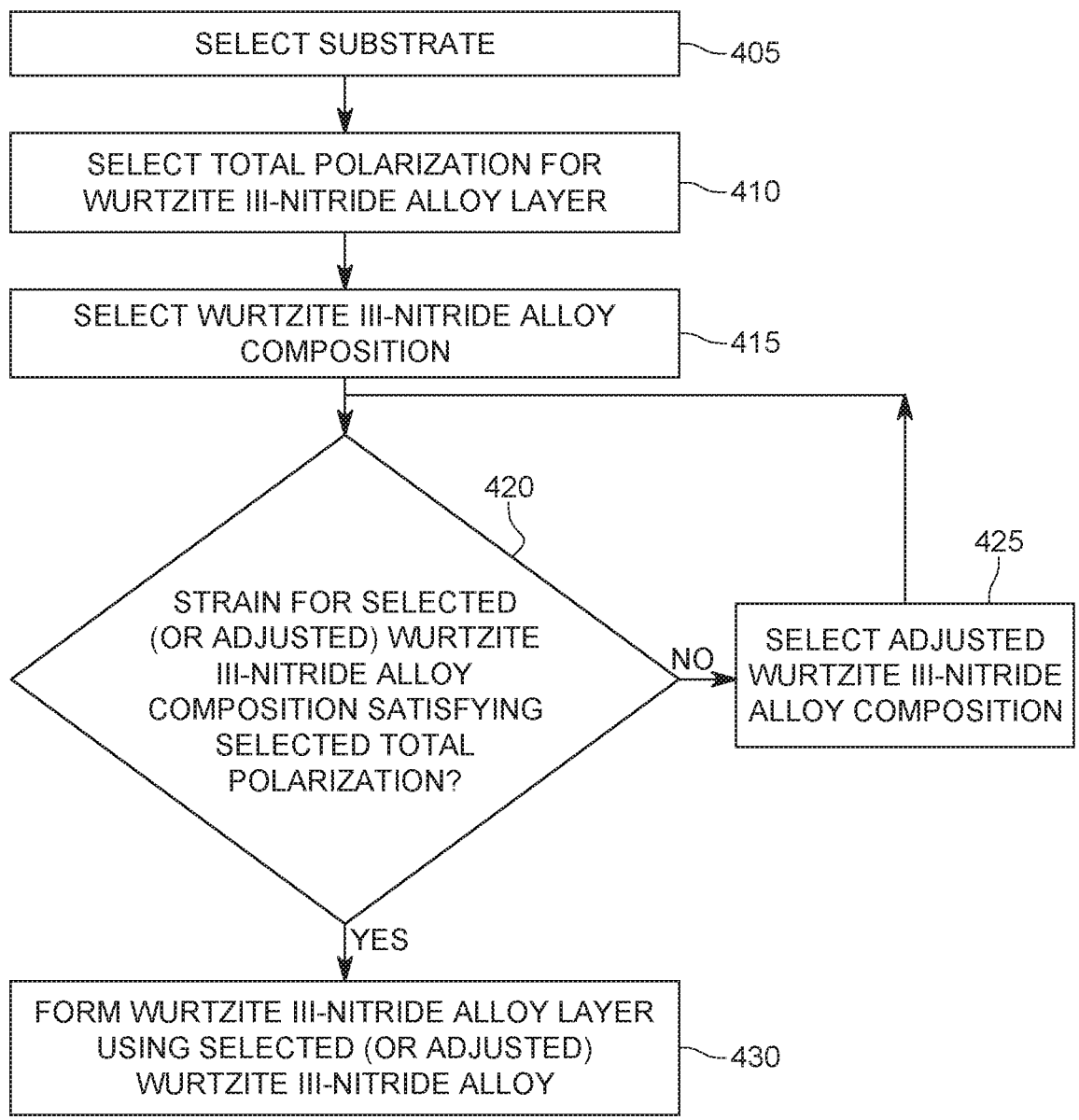
FIG. 4 is a flowchart of a method for forming a wurtzite III-nitride alloy layer according to embodiments.

FIG. 4 is a flowchart of a method for forming a wurtzite III-nitride alloy layer according to embodiments. In this method a substrate, total polarization for the wurtzite III-nitride alloy layer, and the composition of the wurtzite III-nitride alloy layer are selected (steps 405-415). It is then determined whether there is strain value for the selected wurtzite III-nitride alloy composition satisfying the selected total polarization (step 420). This can be determined using the following equation, which is a substitution of equation (35) into equation (1):

$$P(A_xC_{1-x}N) = P_{SP}(x) + e_{eff}\left(\frac{a - a_0}{a_0}\right) \quad (36)$$

Because the composition of the wurtzite III-nitride alloy layer has been selected, and therefore is known, the spontaneous polarization $P_{SP}(x)$ can be determined using equations (4)-(8) and the effective polarization coefficient $e_{eff}$ can be determined using equations (3)-(28). Thus, assuming that the substrate and the wurtzite III-nitride alloy have different compositions, the only variable affecting the strain would be the thickness of wurtzite III-nitride alloy layer.

If there is not a strain value for the selected III-nitride alloy composition satisfying the selected total polarization ("No" path out of decision step 420), then an adjusted wurtzite III-nitride alloy composition is selected (step 425) and then it is determined whether there is strain value for the adjusted wurtzite III-nitride alloy composition satisfying the selected total polarization (step 420). If, however, there is a selected (or adjusted) wurtzite III-nitride alloy composition satisfying the selected total polarization ("Yes" path out of decision step 420), then the wurtzite III-nitride alloy layer is formed on the selected substrate using the selected (or adjusted) wurtzite III-nitride alloy composition having the thickness to achieve the strain value (assuming that the compositions of the wurtzite III-nitride alloy and the substrate are different) (step 430).

The formation of the wurtzite III-nitride layer (or wurtzite III-nitride alloy layer) in the method of FIG. 4 can employ metalorganic vapor deposition, molecular beam epitaxy, high-temperature post-deposition annealing, or any other similar process.

Although FIG. 4 illustrates the selections in steps 405-415 being performed in a particular order and in a serial fashion, these selections can be made in a different order and/or can be performed in parallel.

Figure 5:
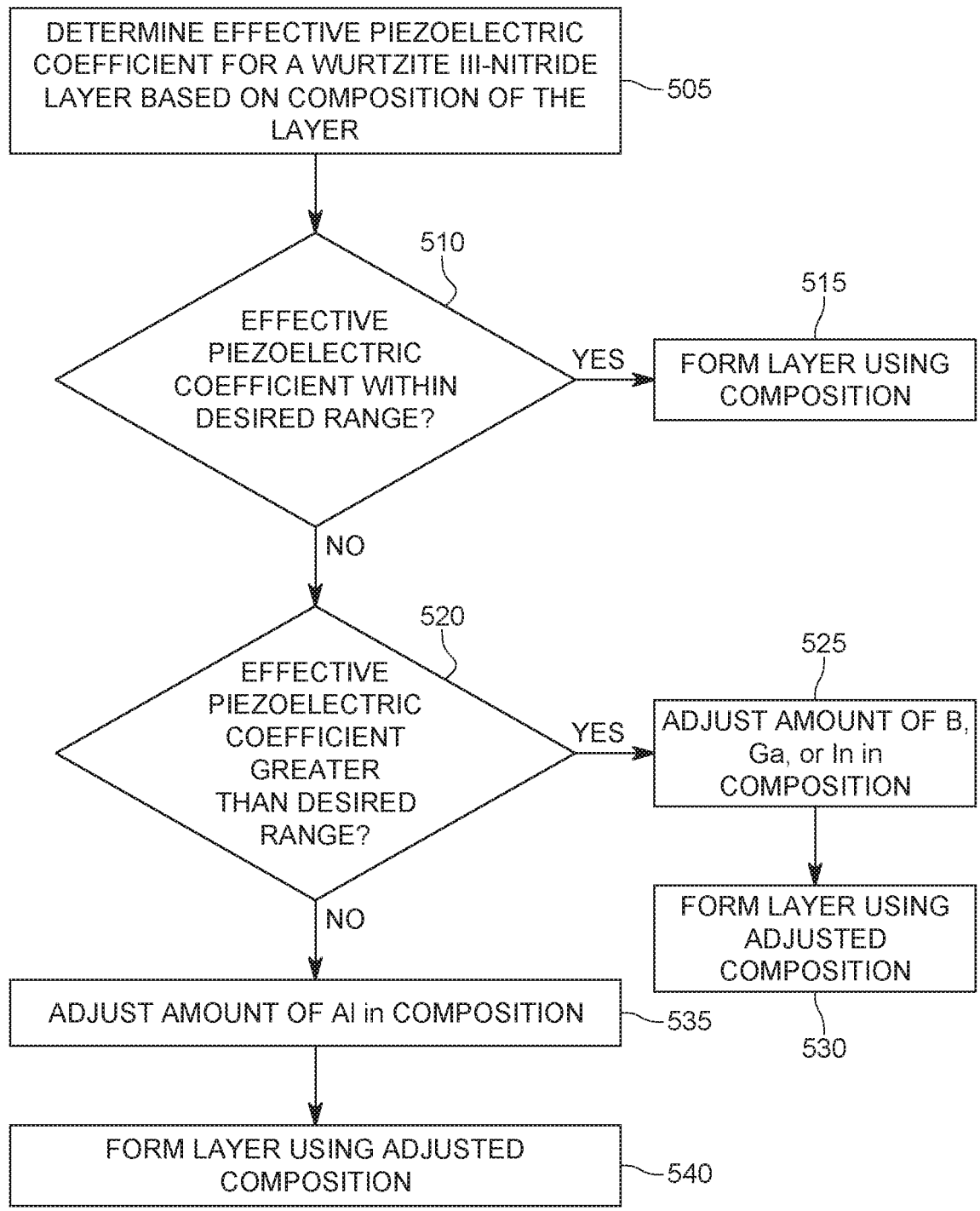
FIG. 5 is a flowchart of a method of forming a wurtzite III-nitride layer according to embodiments.

Although determining the effective piezoelectric coefficient $e_{eff}$ for a wurtzite III-nitride alloy layer having a specific composition of III-nitride elements is useful, it would also be useful to determine how to adjust the composition of a wurtzite III-nitride layer to achieve a particular effective piezoelectric coefficient or a particular effective piezoelectric coefficient within a desired range of effective piezoelectric coefficients. FIG. 5 is a flowchart illustrating such a method. Initially, an effective piezoelectric coefficient for a wurtzite III-nitride layer is determined based on the composition of the layer (step 505), which can be achieved using equations (3)-(28). It is then determined whether this effective piezoelectric coefficient is within a desired effective piezoelectric coefficient range (step 510). The desired effective piezoelectric coefficient range can be selected based on the intended use of the wurtzite III-nitride layer. Thus, for example, if the wurtzite III-nitride layer is intended to generate a large amount of piezoelectricity, the effective piezoelectric coefficient range is selected to encompass large effective piezoelectric coefficients, and vice-versa.

If the determined effective piezoelectric coefficient is within the desired range ("Yes" path out of decision step 510), then the wurtzite III-nitride layer is formed based on the composition of the layer (step 515). If, however, the determined effective piezoelectric coefficient is not within the desired range ("No" path out of decision step 510), then it is determined whether the determined effective piezoelectric coefficient is greater than the desired range (step 520). If the determined effective piezoelectric coefficient is greater than the desired range ("Yes" path out of decision step 520), then the amount of boron, gallium, or indium in the composition is adjusted to reduce the effective piezoelectric coefficient (step 525). The increase in the amount of boron, gallium, or indium can be either an increase from having none of these elements in the original composition to having some amount of these elements in the adjusted composition (in the case of the initial composition of the wurtzite III-nitride layer comprising a single group-III-element, a ternary wurtzite III-nitride alloy layer is formed) or can be an increase in the initial amount of boron, gallium, or indium that was already present in the initial composition (in the case that the initial composition of the wurtzite III-nitride layer already includes the group-III element, then amount of that group-III element is increased). The wurtzite III-nitride layer is then formed using the adjusted composition so that it exhibits an effective piezoelectric coefficient within the desired range (step 530).

If the effective piezoelectric coefficient is less than the desired range ("No" path out of decision step 520), then the amount of aluminum in the composition is adjusted to increase the effective piezoelectric coefficient (step 535). The increase in the amount of aluminum can be either an increase from having no aluminum in the original composition to having some amount of aluminum in the adjusted composition (in the case of the initial composition of the wurtzite III-nitride layer comprising a single group-III element, then a ternary wurtzite III-nitride alloy layer is formed) or can be an increase in the initial amount of aluminum that was already present in the initial composition (in the case that the initial composition of the wurtzite III-nitride layer already includes the group III element, then amount of that group-III element is decreased). The wurtzite III-nitride layer is then formed using the adjusted composition so that it exhibits an effective piezoelectric coefficient within the desired range (step 540).

The formation of the wurtzite III-nitride layer (or wurtzite III-nitride alloy layer) in the method of FIG. 5 can employ metalorganic vapor deposition, molecular beam epitaxy, high-temperature post-deposition annealing, or any other similar process.

This method employs a range of desired sensitives to strain because the compositions that may be determined to achieve a particular effective piezoelectric coefficient may not be realizable with particular formation technologies. Because in practice it is not always necessary to achieve a particular effective piezoelectric coefficient value, but instead to achieve an effective piezoelectric coefficient that provides a greater or lesser piezoelectric response, identifying a range of effective piezoelectric coefficients provides greater flexibility. Nonetheless, the method of FIG. 5 can also be employed to achieve a particular effective piezoelectric coefficient, in which case each reference to a range in the method would be replaced with particular effective piezoelectric coefficient that is desired.

The discussion above in connection with FIG. 5 addresses a single wurtzite III-nitride layer, which can be implemented as an energy storage device, such as a battery, or implemented into a microelectromechanical systems (MEMS). Specifically, the single wurtzite III-nitride layer can be optimized to operate as an energy storage device by optimizing the effective piezoelectric coefficient. The higher the value of the effective piezoelectric coefficient, the more piezoelectricity that is generated in response to the same amount of strain. Thus, the composition of the wurtzite III-nitride layer can be selected so that the layer is highly sensitive to strain, and thus the resulting energy storage device can be optimized for energy storage purposes.

Figures 6A, 6B:
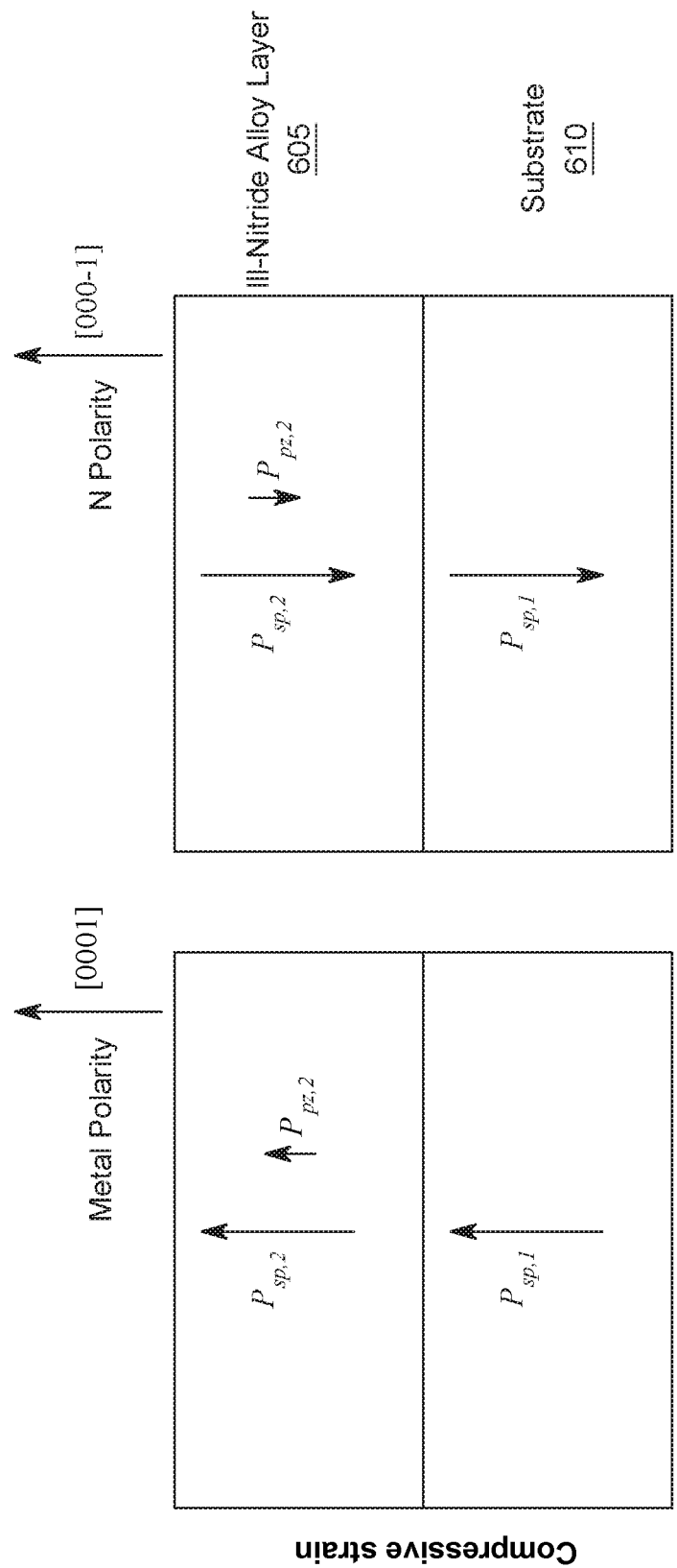
FIGS. 6A-6D are block diagrams illustrating spontaneous and piezoelectric polarizations under different strains and polarities according to embodiments.

The discussion above in connection with FIGS. 1, 3, and 4 involves forming a wurtzite III-nitride layer on a substrate. A few observations with respect to the behavior of the piezoelectric and spontaneous polarization of the wurtzite III-nitride layer and of the substrate will now be presented in connection with FIGS. 6A-6D. Turning first to FIG. 6A, when a wurtzite III-nitride layer 605 is formed on a substrate 610 under compressive strain and for metal polarity, piezoelectric polarization $P_{pz,2}$ of the wurtzite III-nitride layer 605 points up, adding to the spontaneous polarization $P_{sp,2}$ pointing in the same direction. As illustrated in FIG. 6B, under compressive strain and for N polarity, piezoelectric polarization $P_{pz,2}$ of the wurtzite III-nitride layer 605 points down, adding to the spontaneous polarization $P_{sp,2}$ pointing in the same direction.

Figures 6C, 6D:
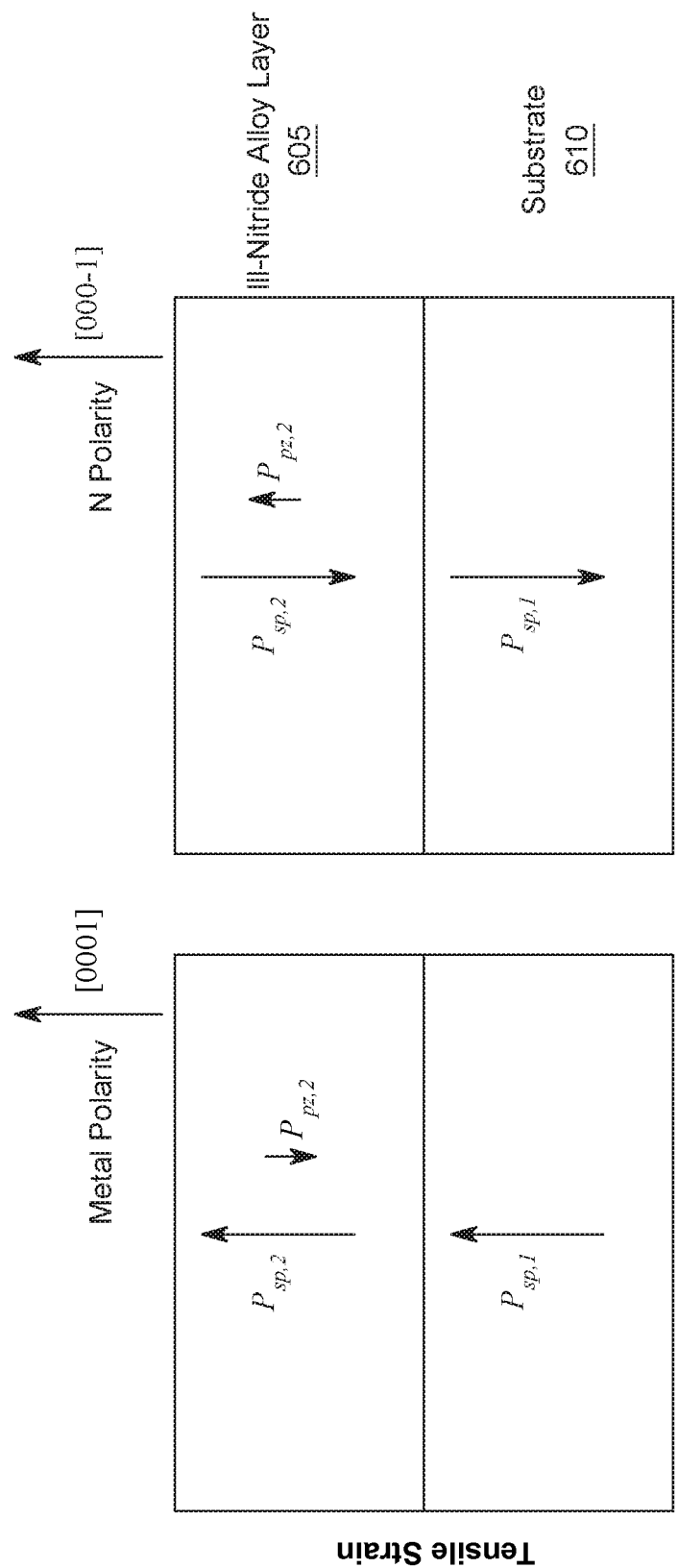

Turning now to FIG. 6C, when a wurtzite III-nitride layer 605 is formed on a substrate 610 under tensile strain and for metal polarity, the piezoelectric polarization $P_{pz,2}$ of the wurtzite III-nitride layer 605 points down, compensating the spontaneous polarization $P_{sp,2}$ pointing in the opposite direction. As illustrated in FIG. 6D, under tensile strain and for N polarity, piezoelectric polarization $P_{pz,2}$ of the wurtzite III-nitride layer 605 points up, compensating the spontaneous polarization $P_{sp,2}$ pointing in the opposite direction. Thus, as will be appreciated from FIGS. 6A-6D, the piezoelectric polarization adds up to the spontaneous polarization under compressive strain and the piezoelectric polarization diminishes the spontaneous polarization under tensile strain regardless of polarity.

These findings are based on equations (9)-(18). Specifically, based on those equations, it can be appreciated that BAlN and BGaN alloys have a piezoelectric constant $e_{31}$ that could be negative or positive and a piezoelectric constant $e_{33}$ that could be negative or positive. AlGaN, InGaN, and InAlN all have a piezoelectric constant $e_{31}$ that is negative and a piezoelectric constant $e_{33}$ that is positive. This ensures that the effective piezoelectric coefficient $e_{eff}$ of AlGaN, InGaN, and InAlN are negative.

The spontaneous polarization of boron nitride is so large that the effective piezoelectric coefficient $e_{eff}$ of BAlN and BGaN are also negative. All of the III-nitrides and their alloys having negative effective piezoelectric coefficient $e_{eff}$ values are consistent with prior conclusions about the non-linearity of spontaneous polarization values, which means that polarization becomes smaller as the cell volume is stretched or the material is under tensile in the c-plane and vice-versa. Accordingly, the polarization properties with the spontaneous polarization and piezoelectric polarization constants as a whole indicate that the cell volume is the determinant factor of the polarization value. This has a profound implication for polarization engineering of nitride-based semiconductor devices. For example, if a thin layer with a smaller lattice and a larger spontaneous polarization value is grown on a substrate and fully strained, the tensile strain can act as a volume dilution and potentially leads to zero polarization difference between the epitaxial layer and the substrate due to the induced negative piezoelectric polarization, and vice-versa.

The discussion above is with respect to certain wurtzite III-nitride ternary alloys. It should be recognized that this is intended to cover both alloys with two III-nitride elements, as well alloys having additional elements that may arise in insignificant concentrations due to, for example, contaminants or impurities becoming part of one or both layers during the process of forming the layers. These contaminants or impurities typically comprise less than 0.1% of the overall composition of the III-nitride ternary alloy layer. Further, those skilled in the art would also consider a III-nitride alloy as a ternary alloy when, in addition to two group III elements, there is an insubstantial amount of other elements, including other group III elements. Those skilled in the art would consider a concentration of 0.1% or less of an element being an insubstantial amount. Thus, for example, one skilled in the art would consider a layer comprising $Al_xGa_{1-x-y}In_yN$, where y≤0.1%, as a ternary alloy because it includes an insubstantial amount of indium. Similarly, a wurtzite III-nitride binary composition can include insignificant concentrations of additional elements while still being considered a binary composition.

The disclosed embodiments provide methods for forming semiconductor devices having at least one III-nitride alloy layer exhibiting a desired effective piezoelectric coefficient (or ranges of effective piezoelectric coefficients). It should be understood that this description is not intended to limit the invention. On the contrary, the exemplary embodiments are intended to cover alternatives, modifications and equivalents, which are included in the spirit and scope of the invention as defined by the appended claims. Further, in the detailed description of the exemplary embodiments, numerous specific details are set forth in order to provide a comprehensive understanding of the claimed invention. However, one skilled in the art would understand that various embodiments may be practiced without such specific details.

Although the features and elements of the present exemplary embodiments are described in the embodiments in particular combinations, each feature or element can be used alone without the other features and elements of the embodiments or in various combinations with or without other features and elements disclosed herein.

This written description uses examples of the subject matter disclosed to enable any person skilled in the art to practice the same, including making and using any devices or systems and performing any incorporated methods. The patentable scope of the subject matter is defined by the claims, and may include other examples that occur to those skilled in the art. Such other examples are intended to be within the scope of the claims.

What is claimed is:

1. A method for forming a semiconductor device, the method comprising:
    selecting a substrate on which a wurtzite III-nitride alloy layer will be formed;
    selecting a piezoelectric polarization for the wurtzite III-nitride alloy layer;
    selecting an effective piezoelectric coefficient for the wurtzite III-nitride alloy layer;
    determining whether there is a wurtzite III-nitride alloy composition satisfying the selected effective piezoelectric coefficient;
    determining whether there is a thickness for a layer formed from the wurtzite III-nitride alloy composition satisfying the selected piezoelectric polarization based on the selected substrate and the selected effective piezoelectric coefficient; and
    forming, responsive to the determination that there is a wurtzite III-nitride alloy composition having a lattice constant satisfying the selected effective piezoelectric coefficient and a thickness for the layer formed from the wurtzite III-nitride alloy composition satisfying the selected piezoelectric polarization, the wurtzite III-nitride alloy layer on the substrate comprising the wurtzite III-nitride alloy composition satisfying the selected effective piezoelectric coefficient and having the thickness satisfying the selected piezoelectric polarization.

2. The method of claim 1, wherein when it is determined that there are no wurtzite III-nitride alloy compositions satisfying the selected effective piezoelectric coefficient, the method further comprises:
    selecting an adjusted effective piezoelectric coefficient;
    determining whether there is a thickness for the layer formed from the wurtzite III-nitride alloy composition satisfying the adjusted piezoelectric polarization; and
    forming, responsive to the determination that there is a wurtzite III-nitride alloy composition having a lattice constant satisfying the adjusted effective piezoelectric coefficient and a thickness for the layer formed from the wurtzite III-nitride alloy composition satisfying the adjusted piezoelectric polarization, the wurtzite III-nitride alloy layer on the substrate comprising the wurtzite III-nitride alloy composition satisfying the adjusted effective piezoelectric coefficient and having the thickness satisfying the selected piezoelectric polarization.

3. The method of claim 1, wherein when it is determined that there are no thicknesses for a layer formed from the wurtzite III-nitride alloy composition having a lattice constant satisfying the selected piezoelectric polarization, the method further comprises:
    selecting an adjusted effective piezoelectric coefficient;
    determining whether there is another wurtzite III-nitride alloy composition having a lattice constant satisfying the adjusted effective piezoelectric coefficient;
    determining whether there is a thickness for the layer formed from the another wurtzite III-nitride alloy composition satisfying the piezoelectric polarization; and
    forming, responsive to the determination that there is another wurtzite III-nitride alloy composition having a lattice constant satisfying the adjusted effective piezoelectric coefficient and a thickness for the layer formed from the another wurtzite III-nitride alloy composition satisfying the adjusted piezoelectric polarization, the wurtzite III-nitride alloy layer on the substrate comprising the another wurtzite III-nitride alloy composition satisfying the adjusted effective piezoelectric coefficient and having the thickness satisfying the selected piezoelectric polarization.

4. The method of claim 1, wherein the determination of whether there is a wurtzite III-nitride alloy composition satisfying the selected effective piezoelectric coefficient comprises:
    selecting a wurtzite III-nitride alloy $A_xC_{1-x}N$, wherein A and C are III-nitride elements and x is an amount of element A relative to an amount of element C in the wurtzite III-nitride alloy layer; and determining whether the selected wurtzite III-nitride alloy $A_xC_{1-x}N$, satisfies the selected effective piezoelectric coefficient $e_{eff}$ based on the following equation $$2\left(e_{31}(x) - P_{SP}(x) - \frac{C_{13}(x)}{C_{33}(x)}e_{33}(x)\right)$$

wherein $e_{31}(x)$ and $e_{33}(x)$ are the piezoelectric constants for the selected wurtzite III-nitride alloy $A_xC_{1-x}N$,
wherein $C_{11}(x)$ and $C_{13}(x)$ are the elastic constants for selected wurtzite III-nitride alloy $A_xC_{1-x}N$, and
wherein $P_{sp}(x)$ is the spontaneous polarization of the wurtzite III-nitride alloy layer comprising the selected wurtzite III-nitride alloy $A_xC_{1-x}N$.

5. The method of claim 1, wherein the determination of whether there is a wurtzite III-nitride alloy composition the selected effective piezoelectric coefficient comprises:
generating graph of lattice constant as a function of effective piezoelectric coefficient for a plurality of different wurtzite III-nitride alloy compositions; and
determining, using the graph, whether any of the plurality of different wurtzite III-nitride alloy compositions satisfy the selected effective piezoelectric coefficient.

6. The method of claim 5, further comprising:
identifying, using the graph, a lattice constant corresponding to one or more wurtzite III-nitride alloy compositions satisfying the selected effective piezoelectric coefficient,
wherein the identified lattice constant is used in the determination of whether there is a layer thickness for the layer formed from the wurtzite III-nitride alloy composition satisfying the selected piezoelectric polarization.

7. The method of claim 1, wherein the wurtzite III-nitride alloy layer comprises $Al_xGa_{1-x}N$, $In_xGa_{1-x}N$, $In_xAl_{1-x}N$, $B_xAl_{1-x}N$, or $B_xGa_{1-x}N$.

8. The method of claim 1, wherein the wurtzite III-nitride alloy layer is formed on the substrate using metalorganic vapor deposition, molecular beam epitaxy, or high temperature post deposition annealing.

9. A method for forming a wurtzite III-nitride layer having an effective piezoelectric coefficient within a desired effective piezoelectric coefficient range, the method comprising:
determining an effective piezoelectric coefficient for the wurtzite III-nitride layer based on a composition of the wurtzite III-nitride layer;
determining whether the determined effective piezoelectric coefficient is within the desired effective piezoelectric coefficient range;
adjusting, responsive to the determination that the determined effective piezoelectric coefficient is not within the desired effective piezoelectric coefficient range, the composition of the wurtzite III-nitride layer, wherein an amount of boron, gallium, or indium is increased in the adjusted composition of the wurtzite III-nitride layer when the determined effective piezoelectric coefficient is greater than the desired effective piezoelectric coefficient range, and wherein an amount of aluminum is increased in the adjusted composition of the wurtzite III-nitride layer when the determined effective piezoelectric coefficient is less than the desired effective piezoelectric coefficient range; and
forming the wurtzite III-nitride layer using the adjusted composition of the wurtzite III-nitride layer.

10. The method of claim 9, wherein the determination of the effective piezoelectric coefficient of the wurtzite III-nitride layer comprises:
selecting piezoelectric constants for the wurtzite III-nitride layer based on a group-III element or group-III elements of the wurtzite III-nitride layer;
selecting elastic constants for the wurtzite III-nitride alloy layer based on the group-III element or group-III elements of the wurtzite III-nitride layer;
selecting a spontaneous polarization for the wurtzite III-nitride layer based on the group-III element or group-III elements of the wurtzite III-nitride layer;
determining the particular composition of the group-III element or group-III elements of the wurtzite III-nitride layer,
wherein, the effective piezoelectric coefficient is determined based on the selected piezoelectric constants, elastics constants, spontaneous polarization, and the particular composition of the group-III element or group-III elements of the wurtzite III-nitride layer.

11. The method of claim 10, wherein
the effective piezoelectric coefficient is determined based on the following equation $$2\left(e_{31}(x) - P_{SP}(x) - \frac{C_{13}(x)}{C_{33}(x)}e_{33}(x)\right)$$

x is an amount of the group-III element or x is an amount of one of the group-IIII elements in the wurtzite III-nitride layer relative to an amount of the other one of the group-III elements in the wurtzite III-nitride layer,
$e_{31}(x)$ and $e_{33}(x)$ are the piezoelectric constants for the particular composition of the group-III element or group-III elements,
$C_{11}(x)$ and $C_{13}(x)$ are the elastic constants for the particular composition of the group-III element or group-III elements, and
$P_{sp}(x)$ is the spontaneous polarization of the wurtzite III-nitride layer for the particular composition of the group-III element or group-III elements.

12. The method of claim 9, wherein the wurtzite III-nitride layer is formed on a substrate.

13. The method of claim 9, wherein the wurtzite III-nitride layer is formed without a substrate.

14. The method of claim 9, wherein the wurtzite III-nitride layer comprises $Al_xGa_{1-x}N$, $In_xGa_{1-x}N$, $In_xAl_{1-x}N$, $B_xAl_{1-x}N$, or $B_xGa_{1-x}N$.

15. The method of claim 9, wherein the wurtzite III-nitride alloy layer is formed using metalorganic vapor deposition, molecular beam epitaxy, or high temperature post deposition annealing.

16. A method for forming a semiconductor device, the method comprising:
selecting a substrate on which a wurtzite III-nitride alloy layer will be formed;
selecting a piezoelectric polarization for the wurtzite III-nitride alloy;
selecting a wurtzite III-nitride alloy composition for the wurtzite III-nitride alloy layer;
determining whether there is a strain value for the selected wurtzite III-nitride alloy composition satisfying the selected piezoelectric polarization; and
forming, responsive to the determination that there is a strain value for the selected wurtzite III-nitride alloy composition satisfying the selected piezoelectric polarization, the wurtzite III-nitride alloy layer having the selected wurtzite III-nitride alloy composition on the selected substrate so that the formed wurtzite III-nitride alloy layer exhibits the strain value, wherein the determination of whether there is a strain value for the selected wurtzite III-nitride alloy composition satisfying the selected piezoelectric polarization is based on the following equation:

$$P_{PZ} = e_{eff}\varepsilon_1$$

wherein $P_{PZ}$ is the selected piezoelectric polarization, $e_{eff}$ is an effective piezoelectric coefficient that is based on the selected wurtzite III-nitride alloy composition, and $\varepsilon_1$ is the strain.

17. The method of claim 16, wherein when it is determined that there is not a strain value for the selected wurtzite III-nitride alloy composition satisfying the selected piezoelectric polarization, the method further comprises:
   selecting an adjusted wurtzite III-nitride alloy composition for the wurtzite III-nitride alloy layer;
   determining whether there is a strain value for the adjusted wurtzite III-nitride alloy composition satisfying the selected piezoelectric polarization; and
   forming, responsive to the determination that there is a strain value for the adjusted wurtzite III-nitride alloy composition satisfying the selected piezoelectric polarization, the wurtzite III-nitride alloy layer having the adjusted wurtzite III-nitride alloy composition on the selected substrate so that the formed wurtzite III-nitride alloy layer exhibits the strain value.

18. The method of claim 16, wherein the selected wurtzite III-nitride alloy composition comprises $A_xC_{1-x}N$ and the effective piezoelectric coefficient $e_{eff}$ is determined based on the following equation:

$$2\left(e_{31}(x) - P_{SP}(x) - \frac{C_{13}(x)}{C_{33}(x)}e_{33}(x)\right)$$

wherein $e_{31}(x)$ and $e_{33}(x)$ are the piezoelectric constants for the selected wurtzite III-nitride alloy composition $A_xC_{1-x}N$, wherein $C_{11}(x)$ and $C_{13}(x)$ are the elastic constants for selected wurtzite III-nitride alloy composition $A_xC_{1-x}N$, and wherein $P_{SP}(x)$ is the spontaneous polarization of the wurtzite III-nitride alloy layer comprising the selected wurtzite III-nitride alloy composition $A_xC_{1-x}N$.

19. The method of claim 16, wherein the selected wurtzite III-nitride alloy composition comprises $Al_xGa_{1-x}N$, $In_xGa_{1-x}N$, $In_xAl_{1-x}N$, $B_xAl_{1-x}N$, or $B_xGa_{1-x}N$.

* * * * *